US012757717B2

(12) United States Patent
Anderson et al.

(10) Patent No.: US 12,757,717 B2
(45) Date of Patent: Oct. 6, 2026

(54) VERTICAL-TRANSPORT FIELD-EFFECT TRANSISTORS WITH SHARED BACKSIDE POWER SUPPLY

(71) Applicant: International Business Machines Corporation, Armonk, NY (US)

(72) Inventors: Brent A. Anderson, Jericho, VT (US); Albert M. Chu, Nashua, NH (US); Ruilong Xie, Niskayuna, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 770 days.

(21) Appl. No.: 17/936,393

(22) Filed: Sep. 29, 2022

(65) Prior Publication Data

US 2024/0113021 A1 Apr. 4, 2024

(51) Int. Cl.

*H10W 20/41* (2026.01)
*H10D 30/63* (2025.01)
*H10D 64/23* (2025.01)

(52) U.S. Cl.

CPC .......... *H10W 20/427* (2026.01); *H10D 30/63* (2025.01); *H10D 64/252* (2025.01)

(58) Field of Classification Search

CPC .. H01L 23/5286; H10D 30/63; H10D 64/252; H10D 84/83; H10D 84/0149; H10D 84/016; H10D 84/038; H10W 20/427

USPC .......................................................... 257/329

See application file for complete search history.

(56) References Cited

U.S. PATENT DOCUMENTS

| | | | | |
|---|---|---|---|---|
| 9,653,360 | B2 | 5/2017 | Anderson | |
| 9,761,712 | B1 | 9/2017 | Anderson | |
| 10,074,570 | B2 | 9/2018 | Anderson | |
| 10,985,064 | B2 | 4/2021 | Zhang | |
| 11,189,692 | B2 * | 11/2021 | Do | H10D 30/63 |
| 11,271,106 | B2 | 3/2022 | Bao | |
| 11,295,985 | B2 | 4/2022 | Zhang | |
| 2007/0146008 | A1 * | 6/2007 | Tak | H03F 3/45188 257/E21.41 |
| 2008/0135932 | A1 * | 6/2008 | Ozeki | H10D 88/01 257/334 |
| 2017/0309527 | A1 * | 10/2017 | Cheng | H10D 30/024 |
| 2017/0309631 | A1 * | 10/2017 | Cheng | H10D 84/038 |
| 2020/0144260 | A1 | 5/2020 | Do | |
| 2020/0144418 | A1 | 5/2020 | Do | |

(Continued)

FOREIGN PATENT DOCUMENTS

| | | | |
|---|---|---|---|
| CN | 119968941 | A | 5/2025 |
| WO | 2015200343 | A1 | 12/2015 |
| WO | 2024/069281 | A1 | 4/2024 |

OTHER PUBLICATIONS

International Search Report and Written Opinion, International Application No. PCT/IB2023/058770, International Filing Date Sep. 5, 2023.

*Primary Examiner* — Mohammad M Hoque
(74) *Attorney, Agent, or Firm* — Gavin Giraud

(57) ABSTRACT

A first VTFET is provided on a wafer. A second VTFET is adjacent to the first VTFET on the wafer. A backside power deliver network is on a backside of the wafer. A shared frontside contact is on a frontside of the wafer. The shared frontside contact is connected to a first top source/drain region of the first VTFET, a second top source/drain region of the second VTFET, and the backside power delivery network.

20 Claims, 7 Drawing Sheets

(56) References Cited

U.S. PATENT DOCUMENTS

| | | | | |
|---|---|---|---|---|
| 2020/0381300 | A1* | 12/2020 | Zhang | H10D 86/01 |
| 2021/0082902 | A1 | 3/2021 | Sobue | |
| 2021/0242202 | A1 | 8/2021 | Do | |
| 2022/0045167 | A1* | 2/2022 | Do | H10D 30/63 |
| 2022/0148969 | A1 | 5/2022 | Xie | |
| 2022/0223523 | A1 | 7/2022 | Lee | |
| 2022/0293523 | A1* | 9/2022 | Gardner | H10D 84/038 |
| 2024/0105709 | A1* | 3/2024 | Sinha | H10D 84/85 |
| 2024/0105727 | A1* | 3/2024 | Miao | H10D 84/0195 |

* cited by examiner

VERTICAL-TRANSPORT FIELD-EFFECT TRANSISTORS WITH SHARED BACKSIDE POWER SUPPLY

BACKGROUND OF THE INVENTION

The present invention relates generally to the field of semiconductor device manufacture and more particularly to vertical-transport field-effect transistors (VTFET) with a shared backside power supply.

Semiconductor devices are fabricated by sequentially depositing insulating (dielectric) layers, conductive layers, and semiconductor layers of material over a semiconductor substrate, and patterning the various layers using lithography to form circuit components and elements thereon. Generally, these semiconductor devices include a plurality of circuits which form an integrated circuit (IC) fabricated on a semiconductor substrate.

Backside power delivery networks are an emerging technology to provide power delivery to circuitry on a wafer. The backside power delivery network is formed on a backside of the wafer as opposed to the frontside of the wafer where circuitry and wiring are traditionally formed. A challenge to backside power delivery is connecting to contacts in circuitry on the frontside of the wafer due to the backside power delivery network needing to cross the device layer in order to connect to contacts on the frontside of the circuitry.

VTFET devices allow for the flow of current vertically, from a bottom source/drain region to a top source/drain region. In a VTFET device, a bottom source/drain region is located closest to the wafer, a gate region is on top of the bottom source/drain region and a top source/drain region is on top of the gate region. The bottom source/drain region is located closest to the wafer the circuit is formed upon and the top source/drain region is located farthest from the wafer the circuit is formed upon. Thus, there is a need to contact the backside power delivery network by the top source/drain region.

SUMMARY

In a first embodiment, a first vertical-transport field-effect transistor (VTFET) is provided on a wafer. In the first embodiment, a second VTFET is adjacent to the first VTFET on the wafer. In the first embodiment, a backside power deliver network is on a backside of the wafer. In the first embodiment, a shared frontside contact is on a frontside of the wafer. In the first embodiment, the shared frontside contact is connected to a first top source/drain region of the first VTFET, a second top source/drain region of the second VTFET, and the backside power delivery network.

In the first embodiment, the first VTFET and the second VTFET are each a first width, and the first width is a contacted poly pitch (CPP), and wherein the shared frontside contact is adjacent to the second VTFET by the first width. In the first embodiment, the backside power delivery network is selected from the group consisting of power or ground. Embodiments of the present invention recognize that common cells that utilize VTFET can reduce library density by 50-75% by contact connection to a backside power delivery network.

In a second embodiment, a plurality of vertical-transport field-effect transistors (VTFET) are in the semiconductor device. In the second embodiment, the semiconductor device includes a backside power delivery network on a backside of the semiconductor device. In the second embodiment, the backside power delivery network is connected to a source/drain region on the backside of at least one of the plurality of VTFET. In the second embodiment, the semiconductor device includes a contact on a frontside of the semiconductor device. In the second embodiment, the contact is connected to the backside power delivery network and a top plurality of source/drain regions of the plurality of VTFET.

In the second embodiment, a first group of VTFET of the plurality of VTFET are horizontally adjacent to a second group of VTFET of the plurality of VTFET. In the second embodiment, a third group of VTFET of the plurality of VTFET are vertically adjacent the first group of VTFET and second group of VTFET. In the second embodiment, a first group of VTFET of the plurality of VTFET are vertically adjacent to a second group of VTFET of the plurality of VTFET. In the second embodiment, a third group of VTFET of the plurality of VTFET are horizontally adjacent the first group of VTFET and second group of VTFET. In the second embodiment, the backside power delivery network is selected from the group consisting of power or ground. Embodiments of the present invention recognize there is a significant area reduction from sharing a bottom supply area with multiple VTFET(s). Embodiments of the present invention provide for a merged RX, or active area, layer that connects any number of neighboring VTFET. Embodiments of the present invention may provide for connection of any number of neighboring VTFET at the contact layer level. Embodiments of the present invention provide for a shared VDD with adjacent neighbors both horizontally and vertically, in other words in either the X or Y direction. Embodiments of the present invention provide for a CPP width area, adjacent to a VTFET, and the CPP width area provides a shared contact and/or RX, or active area, layer with adjacent, both horizontally and vertically, VTFET(s).

In a third embodiment, a first VTFET is on a wafer, a second VTFET is adjacent to the first VTFET and a third VTFET is adjacent to the first VTFET. In the third embodiment, the first VTFET, the second VTFET, and the third VTFET are each a first width, wherein the width is a contacted poly pitch (CPP). In the third embodiment, a shared frontside contact connected to the first VTFET, second VTFET, and third VTFET, wherein the shared frontside contact is on a frontside of the wafer.

In the third embodiment, the shared frontside contact is horizontally adjacent to the first VTFET and second VTFET by the first width and wherein the shared frontside contact is vertically adjacent to the third VTFET by the first width. In the third embodiment, the shared frontside contact is connected to a first top source/drain region of first VTFET, a second top source/drain region of the second VTFET and a third bottom source/drain region of the third VTFET. In the third embodiment, the shared frontside contact is connected to a first top source/drain region of first VTFET, a second bottom source/drain region of the second VTFET and a third top source/drain region of the third VTFET.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
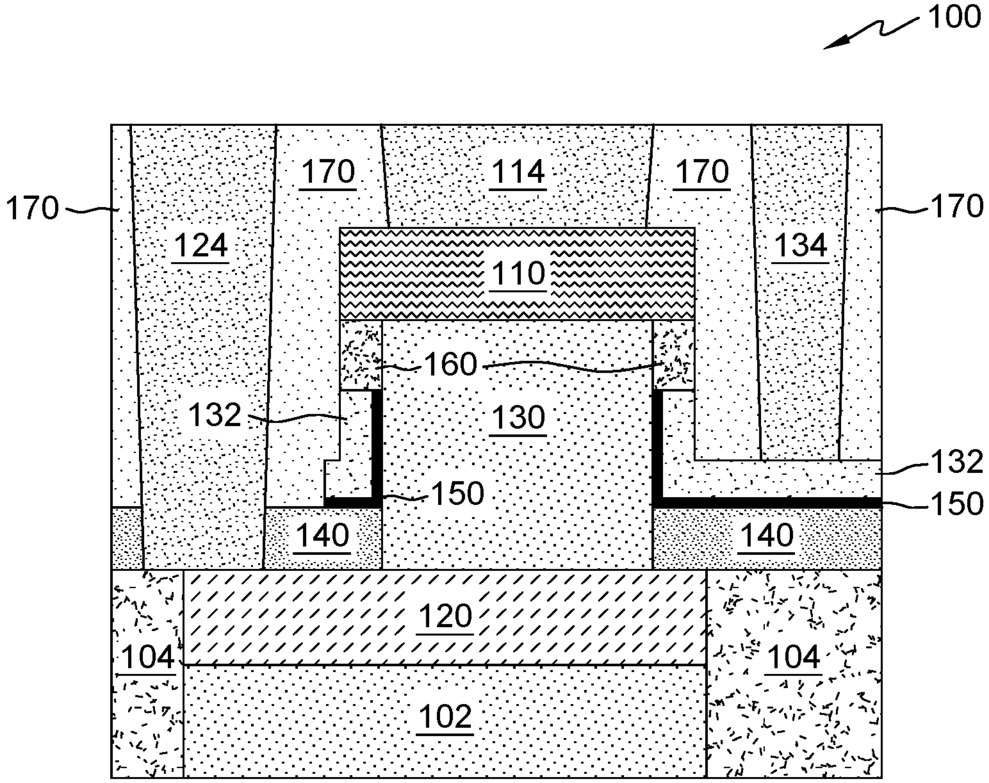
FIG. 1 depicts a cross-section view of a VTFET semiconductor structure with a frontside contact for the top source/drain region, bottom source/drain region, and gate region, in accordance with a first embodiment of the present invention.

Embodiments of the present invention recognize that vertical-transport field-effect transistors (VTFET) have vertical current flow. Embodiments of the present invention recognize that VTFET include a bottom source/drain region and a top source/drain region. Embodiments of the present invention recognize that the bottom source/drain region is closer to the backside of the VTFET (closer to the wafer) and that the top source/drain region is closer to the frontside of the VTFET (closer to the traditional interconnect wiring). Embodiments of the present invention recognize that an input will be to one source/drain region and the output will be to one source/drain region and therefore one of either the input or the output will be on the backside of the device and one of either the input or the output will be on the frontside of the device. Therefore, embodiments of the present invention recognize there is a need for a top source/drain on the frontside of the VTFET to reach the backside of the semiconductor device. Embodiments of the present invention recognize that in conventional VTFETs, the pitch (or width) between gates in adjacent devices in the same semiconductor layer is commonly known as a contacted gate pitch (CGP) or a contact poly pitch (CPP).

Embodiments of the present invention provide for any number of signals (e.g., clock, buss, I/O, power, ground, etc.) to be distributed or delivered to source/drain/gate regions of VTFET through a backside power delivery network. Embodiments of the present invention provide for a shared backside supply (VDD, GND, or both). In an embodiment, a supply voltage may also be called VDD and a ground voltage may also be called VSS or GND. Embodiments of the present invention provide for a merged RX, or active area, layer that connects any number of neighboring VTFET. Embodiments of the present invention may provide for connection of any number of neighboring VTFET at the contact layer level. Embodiments of the present invention provide for a shared VDD with adjacent neighbors both horizontally and vertically, in other words in either the X or Y direction. Embodiments of the present invention provide for a CPP width area, adjacent to a VTFET, and the CPP width area provides a shared contact and/or RX, or active area, layer with adjacent, both horizontally and vertically, VTFET(s).

Embodiments of the present invention recognize there is a significant area reduction from sharing a bottom supply area with multiple VTFET(s). Embodiments of the present invention recognize that library density of common cells that utilize VTFET can be reduced by 50-75% in area. Embodiments of the present invention recognize that supply can be shared with at least three neighbors for VDD and three neighbors for GND. Embodiments of the present invention recognize that a merged RX layer can be shared with three neighbors for a "p-type", as described below, VTFET and three neighbors for a "n-type", as described below, VTFET.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein. Reference will now be made in detail to the embodiments of the present invention, examples of which are illustrated in the accompanying drawings, wherein like reference numerals refer to like elements throughout.

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later. It is to be understood that aspects of the present invention will be described in terms of a given illustrative architecture; however, other architectures, structures, substrate materials, process features and steps can be varied within the scope of aspects of the present invention.

Detailed embodiments of the claimed structures and methods are disclosed herein. The method steps described below do not form a complete process flow for manufacturing integrated circuits, such as semiconductor devices. The present embodiments can be practiced in conjunction with the integrated circuit fabrication techniques currently used in the art, for advanced semiconductor devices, and only so much of the commonly practiced process steps are included as are necessary for an understanding of the described embodiments. The figures represent cross-section portions of a portion of an advanced semiconductor device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

For purposes of the description hereinafter, the terms "upper," "lower," "right," "left," "vertical," "horizontal," "top", "bottom," and derivatives thereof shall relate to the disclosed structures and methods, as oriented in the drawing figures. The terms "overlying," "atop," "over," "on "positioned on," or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes SixGe1-x where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

References in the specification to "one embodiment", "other embodiment", "another embodiment," "an embodiment," etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("ME"). In general, ME uses chemically reactive plasma to remove material deposited on wafers. High-energy ions from the ME plasma attack the wafer surface and react with the surface material(s) to remove the surface material(s).

Deposition processes for the metal liners and sacrificial materials include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Vertical transport field-effect transistors (VTFETs) have become viable device options for scaling semiconductor devices (e.g., complementary metal oxide semiconductor (CMOS) devices) to 5 nanometer (nm) node and beyond. VTFET devices include one or more fin channels with source/drain regions at ends of the fin channels on the top and bottom sides of the fins. Current flows through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FiN-FET-equivalent density at a larger contacted poly pitch (CPP), and providing lower middle-of-line (MOL) resistance.

Figure 2:
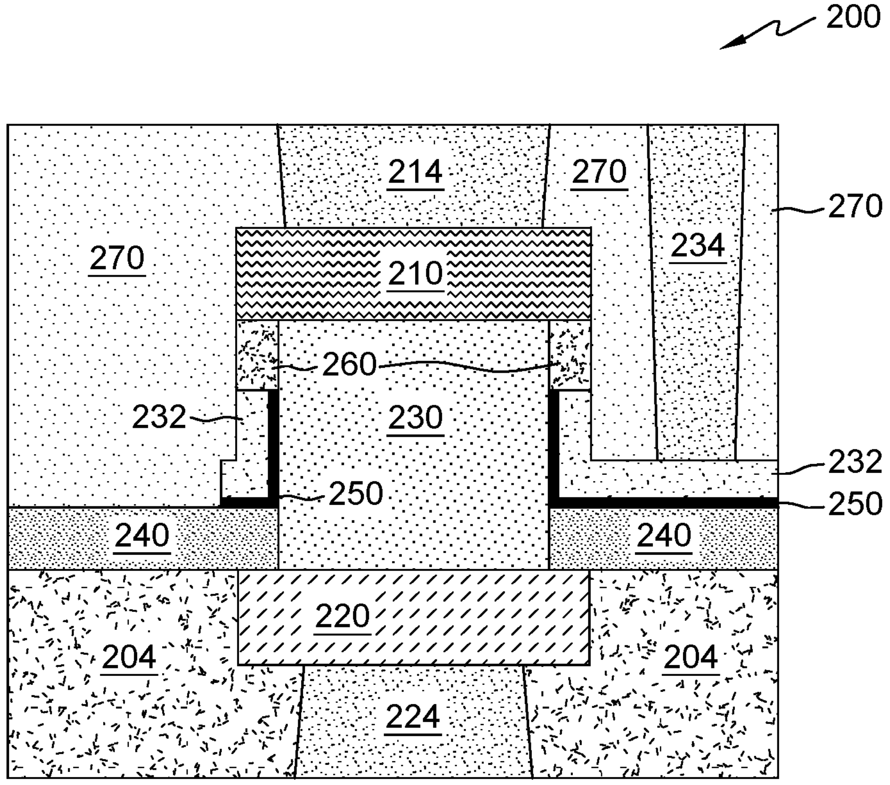
FIG. 2 depicts a cross-section view of a VTFET semiconductor structure with a frontside contact for the top source/drain region and gate region and a backside contact for the bottom source/drain region, in accordance with a first embodiment of the present invention.
Figure 3:
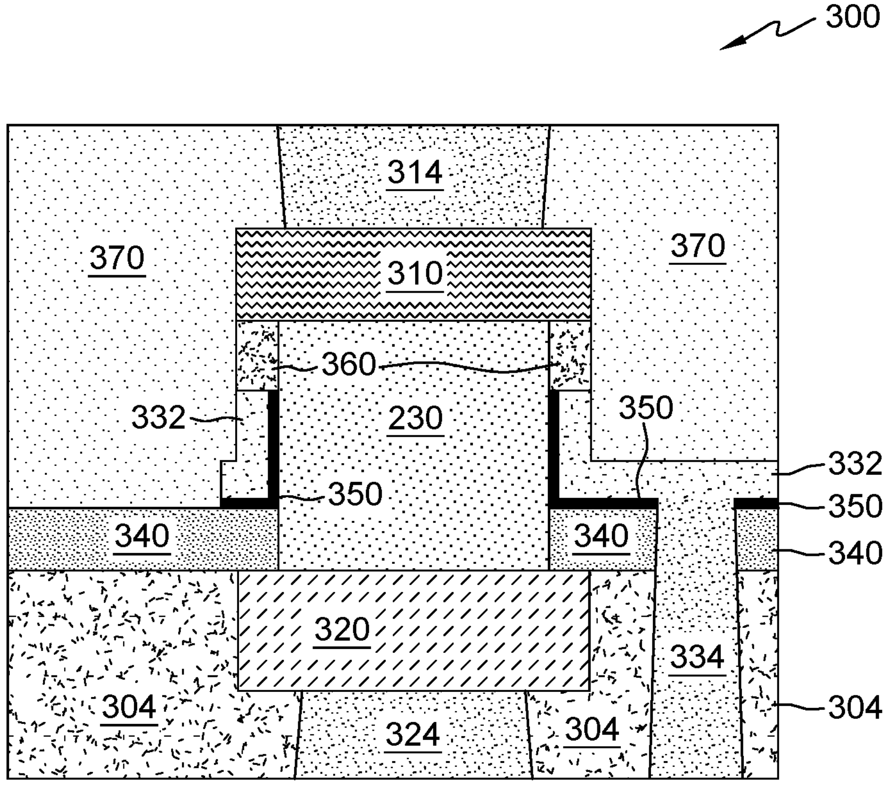
FIG. 3 depicts a cross-section view of a VTFET semiconductor structure with a frontside contact for the top source/drain and a backside contact for the bottom source/drain region and gate region, in accordance with a first embodiment of the present invention.

In a first embodiment, FIG. 1 shows a VTFET 100 with contact 114, contact 124, and contact 134 connected directly to interconnect wiring and/or a power delivery network (not shown) on the frontside of VTFET 100. In a second embodiment, FIG. 2 shows a VTFET 200 with contact 214 and contact 234 connected directly to interconnect wiring and/or a power delivery network (not shown) on the frontside of VTFET 200 and a contact 224 connected directly to interconnect wiring and/or a power delivery network (not shown) on the backside of VTFET 200. In a third embodiment, FIG. 3 shows a VTFET 300 with contact 314 connected directly to interconnect wiring and/or a power delivery network (not shown) on the frontside of VTFET 300 and contact 324 and contact 334 connected directly to interconnect wiring and/or a power delivery network (not shown) on the backside of VTFET 300.

Vertical transport field-effect transistors (VTFETs) have become viable device options for scaling semiconductor devices (e.g., complementary metal oxide semiconductor (CMOS) devices) to 5 nanometer (nm) node and beyond. VTFET devices include one or more fin channels with source/drain regions at ends of the fin channels on the top and bottom sides of the fins. Current flows through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FiN-FET-equivalent density at a larger contacted poly pitch (CPP), and providing lower middle-of-line (MOL) resistance.

In a first embodiment, FIG. 1 shows a VTFET 100 with contact 114, contact 124, and contact 134 connected directly to interconnect wiring and/or a power delivery network (not shown) on the frontside of VTFET 100. In a second embodiment, FIG. 2 shows a VTFET 200 with contact 214 and contact 234 connected directly to interconnect wiring and/or a power delivery network (not shown) on the frontside of VTFET 200 and a contact 224 connected directly to interconnect wiring and/or a power delivery network (not shown) on the backside of VTFET 200. In a third embodiment, FIG. 3 shows a VTFET 300 with contact 314 connected directly to interconnect wiring and/or a power delivery network (not shown) on the frontside of VTFET 300 and contact 324 and contact 334 connected directly to interconnect wiring and/or a power delivery network (not shown) on the backside of VTFET 300.

FIG. 1 is a cross-sectional view of a VTFET 100 formed on a bulk substrate 102. The substrate 102 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

VTFET 100 includes STI region 104 comprised of a dielectric material such as silicon oxide or silicon oxynitride, and is formed by methods known in the art. For example, in one illustrative embodiment, STI region 104 is a shallow trench isolation oxide layer.

VTFET 100 includes top source/drain region 110 and bottom source/drain region 120 on either end of fin 130. In an embodiment, top source/drain region 110 is formed between dielectric layer 170. In an embodiment, bottom source/drain region 120 is formed in substrate 102 between shallow trench isolation region 104. Top source/drain region 110 and bottom source/drain region 120 are formed by, for example, epitaxial growth processes. The epitaxially grown top source/drain region 110 and bottom source/drain region 120 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$. According to an embodiment, the bottom source/drain region 120 can be boron doped SiGe for a p-type field-effect transistor (P-FET) or phosphorous doped silicon for an n-type field-effect transistor (N-FET). It is to be understood that the term "source/drain region" as used herein means that a given source/drain region can be either a source region or a drain region, depending on the application.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used. After epi formation, drive-in anneals can be applied to move the dopants closer to the bottom of the fin channels.

In an embodiment, as used herein, a "semiconductor fin" or fin 130 refers to a semiconductor material that includes a pair of vertical sidewalls that are parallel to each other. As used herein, a surface is "vertical" if there exists a vertical plane from which the surface does not deviate by more than three times the root mean square roughness of the surface. In an embodiment, each fin 130 has a height ranging from approximately 20 nm to approximately 200 nm, and a width ranging from approximately 5 nm to approximately 30 nm. Other heights and/or widths that are lesser than, or greater than, the ranges mentioned herein can also be used in the present application. Each fin 130 is spaced apart from its nearest neighboring fin 130 by a pitch ranging from approximately 20 nm to approximately 100 nm; the pitch is measured from one point, or reference surface, of one semiconductor fin to the exact same point, or reference surface, on a neighboring semiconductor fin. Also, the fins 130 are generally oriented parallel to each other. Although the present application describes and illustrates a single fin 108, any number of fins with gate region surrounding them may be used and the fins may be any shape.

The fin 130 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, fin 130 is silicon.

In an embodiment, bottom spacer layer 140 is formed on the STI region 104 and bottom source/drain region 120. In an embodiment, bottom spacer layer 140 is formed around fin 130. Suitable material for bottom spacer layer 140 includes, for example, silicon boron nitride (SiBN), silicon-borocarbonitride (SiBCN), silicon oxycarbonitride (SiOCN), SiN and $SiO_x$. Bottom spacer layer 140 can be deposited using, for example, directional deposition techniques, such as a high-density plasma (HDP) deposition and gas cluster ion beam (GCIB) deposition. The directional deposition deposits the spacer material preferably on the exposed horizontal surfaces, but not on the lateral sidewalls. Alternatively, the bottom spacer layer 140 can be formed by overfilling the space with dielectric materials, followed by chemical mechanical planarization (CMP) and dielectric recess.

In an embodiment, top spacer layer 160 is formed on the gate region between fin 130 and dielectric layer 170. In an embodiment, top spacer layer 160 is formed around fin 130. Suitable material for top spacer layer 160 includes, for example, silicon boron nitride (SiBN), siliconborocarbonitride (SiBCN), silicon oxycarbonitride (SiOCN), SiN and $SiO_x$. Bottom spacer layer 140 can be deposited using, for example, directional deposition techniques, such as a high-density plasma (HDP) deposition and gas cluster ion beam (GCIB) deposition. The directional deposition deposits the spacer material preferably on the exposed horizontal surfaces, but not on the lateral sidewalls. Alternatively, the top spacer layer 160 can be formed by overfilling the space with dielectric materials, followed by chemical mechanical planarization (CMP) and dielectric recess.

A gate region is formed on bottom spacer layer 140 and around fin 130. In illustrative embodiments, gate region is deposited on bottom spacer layer 140 and around fin 130 employing, for example, ALD, CVD, RFCVD, plasma enhanced CVD (PECVD), physical vapor deposition (PVD), or molecular layer deposition (MLD). The gate region may include a gate dielectric layer 150 and a gate conductor layer 132. The gate dielectric layer 150 may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate conductor layer 132 may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer 132 as desired.

In an embodiment, dielectric layer 170 may be composed of, for example, silicon oxide ($SiO_x$), undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. As indicated above, the term "low-κ" as used herein refers to a material having a relative dielectric constant κ which is lower than that of silicon dioxide. In an embodiment, the dielectric layer 170 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering.

In an embodiment, top source/drain region 110, bottom source drain region 120 and gate region are connected to interconnect wiring and/or a power delivery network (not shown) through contact 114, contact 124, and contact 134, respectively. In an embodiment, as shown in FIG. 1, contact 114, contact 124, and contact 134 to are formed to directly connect to interconnect wiring and/or a power delivery network (not shown) on the frontside of the VTFET 100. In an embodiment, contact 114, contact 124, and contact 134 may include any suitable conductive material, such as, for example, copper, aluminum, tungsten, cobalt, or alloys thereof. Examples of deposition techniques that can be used include, for example, chemical vapor deposition (CVD), plasma enhanced chemical vapor deposition (PECVD), or atomic layer deposition (ALD). In some cases, an electroplating technique can be used to form contact 114, contact 124, and contact 134.

In a second embodiment, FIG. 2 shows a VTFET 200 with contact 214 and contact 234 connected directly to interconnect wiring and/or a power delivery network (not shown) on the frontside of VTFET 200 and a contact 224 connected directly to interconnect wiring and/or a power delivery network (not shown) on the backside of VTFET 200. In the second embodiment, VTFET 200 shares substantially similar features to the features described above in reference to VTFET 100. For example, top source/drain region 210 is substantially similar to top source/drain region 110. It should be noted, while a substrate, similar to substrate 102 shown in FIG. 1, is not shown in FIG. 2, it would be known to one skilled in the art that VTFET 200 would be formed on a substrate similar to substrate 102 shown in FIG. 1.

In the second embodiment, the orientation of contacts in VTFET 200 are the primary differences as compared to VTFET 100. In the second embodiment, contact 214 and contact 234 are connected directly to interconnect wiring and/or a power delivery network (not shown) on the frontside of VTFET 200 and a contact 224 connected directly to interconnect wiring and/or a power delivery network (not shown) on the backside of VTFET 200.

In a third embodiment, FIG. 3 shows a VTFET 300 with contact 314 connected directly to interconnect wiring and/or a power delivery network (not shown) on the frontside of VTFET 300 and contact 324 and contact 334 connected directly to interconnect wiring and/or a power delivery network (not shown) on the backside of VTFET 300. In the third embodiment, VTFET 300 shares substantially similar features to the features described above in reference to VTFET 100 and VTFET 200. For example, top source/drain region 310 is substantially similar to top source/drain region 110 and top source/drain region 210. It should be noted, while a substrate, similar to substrate 102 shown in FIG. 1, is not shown in FIG. 3, it would be known to one skilled in the art that VTFET 300 would be formed on a substrate similar to substrate 102 shown in FIG. 1.

In the third embodiment, the orientation of contacts in VTFET 300 are the are the primary differences as compared to VTFET 100 and VTFET 200. In the third embodiment, contact 314 is connected directly to interconnect wiring and/or a power delivery network (not shown) on the frontside of VTFET 300 and contact 324 and contact 334 are connected directly to interconnect wiring and/or a power delivery network (not shown) on the backside of VTFET 300.

Figure 4A:
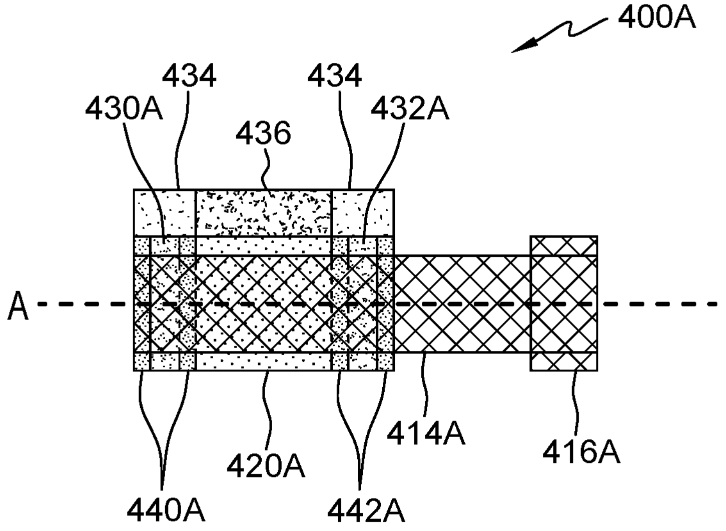
FIG. 4A depicts a top view of the semiconductor structure including two VTFET in parallel in accordance with an embodiment of the present invention.

FIG. 4A depicts a top view of the semiconductor structure 400A including two VTFET in parallel in accordance with an embodiment of the present invention. In an embodiment, the two VTFET in FIG. 4A are shown in parallel. In other words, a shared input is provided to the first VTFET and the second VTFET and a shared output extends from both the first VTFET and second VTFET. As shown in FIG. 4A, the first VTFET includes a shared bottom source/drain region 420A, a fin 430A, and a top source/drain region (not shown). As shown in FIG. 4A, the second VTFET includes a shared bottom source/drain region 420A, a fin 432A, and a top source/drain region (not shown). As described, the top source/drain region for each VTFET is not shown for simplicity of the drawings. It should be noted, in a preferred embodiment, the shared bottom source/drain region 420A may be connected to a backside power delivery network (not shown). In an alternative embodiment, the shared bottom source/drain region 420A may be connected to a frontside power delivery network (not shown).

As shown in FIG. 4A, in an embodiment, the first VTFET includes a gate region 440A surrounding at least a portion of the fin 430A and the second VTFET includes a gate region 442A surrounding at least a portion of the fin 432A. In an embodiment, semiconductor structure 400A includes a shared gate region 434 connected to both the gate region 440A and gate region 442A. In an embodiment, shared gate region 434 is connected to gate contact 436 and gate contact 436 extends towards the frontside of the semiconductor structure 400A. In an embodiment, gate contact 436 may extend towards the backside of the semiconductor structure 400A. In an alternative embodiment, shared gate region 434 may not exist, and both gate region 440A and gate region 442A may have their own gate contact (not shown) that extends towards the frontside or backside of the semiconductor structure 400A.

As shown in FIG. 4A, in an embodiment, the semiconductor structure 400A includes a shared top contact 414A connected to the first VTFET top source/drain region and second VTFET top source/drain region. The shared top contact 414A extends 1 CPP from the VTFET before connecting to the shared backside contact 416A. In an embodiment, the shared backside contact 416A is centered approximately 1 CPP from the center of the adjacent VTFET. In an embodiment, the shared backside contact 416A extends to connect to a backside power delivery network (not shown). In an embodiment, as shown here, shared top contact 414A extends to a left edge of gate region 440A. In alternative embodiments, as known in the art, shared top contact 414A may extend any horizontal distance as long as shared top contact 414A is at least electrically connected to the top source/drain region(s), described below.

Figure 4B:
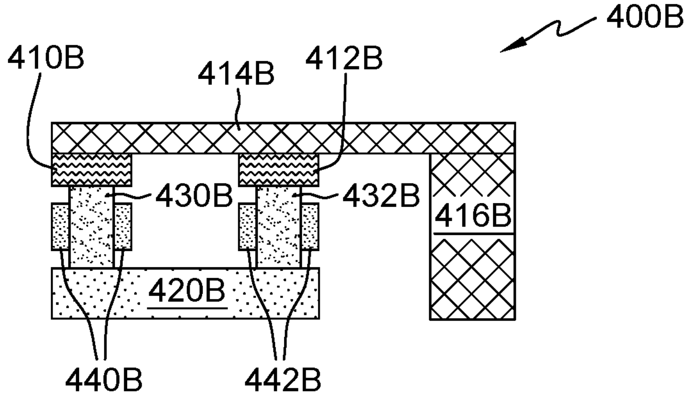
FIG. 4B depicts a cross-sectional view of section A of the semiconductor structure including two VTFET in parallel in accordance with an embodiment of the present invention.

FIG. 4B depicts a cross-sectional view of section A of the semiconductor structure 400B including two VTFET in parallel in accordance with an embodiment of the present invention. As shown in FIG. 4B, the first VTFET includes a shared bottom source/drain region 420B, a fin 430B, a top source/drain region 410B, and a gate region 440B surrounding a portion of fin 430B. As shown in FIG. 4B, the second VTFET includes a shared bottom source/drain region 420B, a fin 432B, a top source/drain region 412B, and a gate region 442B surrounding a portion of fin 432B. It should be noted, in alternative embodiments, the first VTFET and second VTFET may have a shared a top source/drain region or may have individual/separate bottom source/drain regions. As noted above, in a preferred embodiment, the shared bottom source/drain region 420B may be connected to a backside power delivery network (not shown).

As shown in FIG. 4B, in an embodiment, the semiconductor structure 400B includes a shared top contact 414B connected to the first VTFET top source/drain region 410B and second VTFET top source/drain region 410B. The shared top contact 414B extends 1 CPP from the VTFET adjacent to the shared backside contact 416B before connecting to the shared backside contact 416B. In an embodiment, the shared backside contact 416B is centered approximately 1 CPP from the center of the adjacent VTFET. In an embodiment, the shared backside contact 416B extends to connect to a backside power delivery network (not shown). In an embodiment, the shared backside contact 416B is substantially similar to the cell height of either the first VTFET or the second VTFET in semiconductor structure 400B.

Figure 5A:
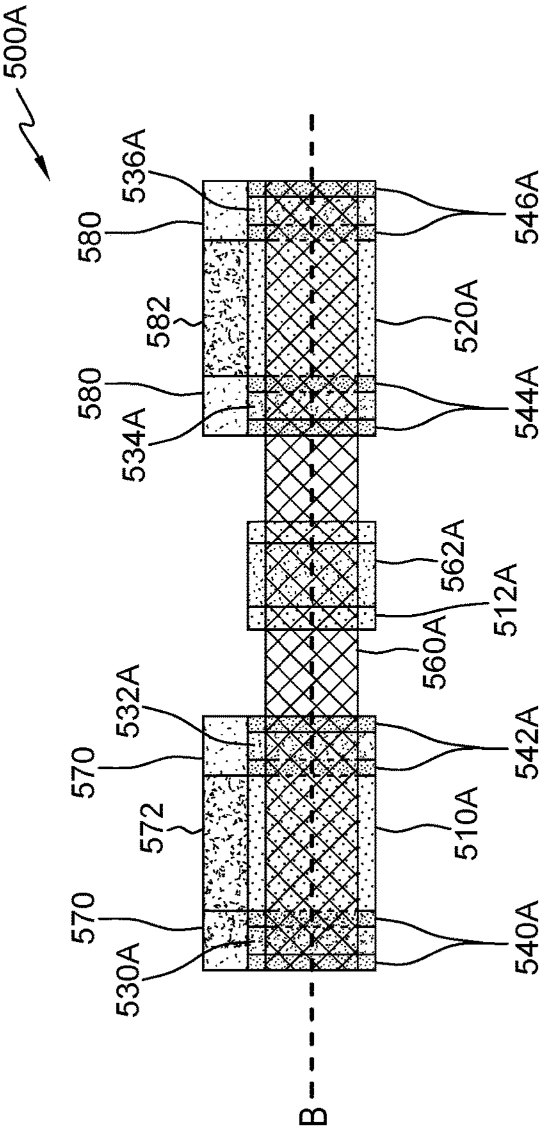
FIG. 5A depicts a top view of the semiconductor structure including two sets in parallel of two VTFET in parallel in accordance with an embodiment of the present invention.

FIG. 5A depicts a top view of the semiconductor structure 500A including two sets in parallel of two VTFET in parallel in accordance with an embodiment of the present invention. In an embodiment, the first two VTFET in FIG. 5A are shown in parallel. In other words, a shared input is provided to the first VTFET and the second VTFET and a shared output extends from both the first VTFET and second VTFET. As shown in FIG. 5A, the first VTFET includes a shared bottom source/drain region 510A, a fin 530A, and a top source/drain region (not shown). As shown in FIG. 5A, the second VTFET includes a shared bottom source/drain region 510A, a fin 532A, and a top source/drain region (not shown). As described, the top source/drain region for each VTFET is not shown for simplicity of the drawings. It should be noted, in a preferred embodiment, the shared bottom source/drain region 510A may be connected to a backside power delivery network (not shown). In an alternative embodiment, the shared bottom source/drain region 510A may be connected to a frontside power delivery network (not shown).

As shown in FIG. 5A, in an embodiment, the semiconductor structure 500A the first VTFET includes a gate region 540A surrounding at least a portion of the fin 530A and the second VTFET includes a gate region 542A surrounding at least a portion of the fin 532A. In an embodiment, semiconductor structure 500A includes a shared gate region 570 connected to both the gate region 540A and gate region 542A. In an embodiment, shared gate region 570 is connected to gate contact 572 and gate contact 572 extends towards the frontside of the semiconductor structure 500A. In an embodiment, gate contact 572 may extend towards the backside of the semiconductor structure 500A. In an alternative embodiment, shared gate region 570 may not exist, and both gate region 540A and gate region 542A may have their own gate contact (not shown) that extends towards the frontside or backside of the semiconductor structure 400A.

In an embodiment, the second two VTFET in FIG. 5A are shown in parallel. In other words, a shared input is provided to the third VTFET and the fourth VTFET and a shared output extends from both the third VTFET and fourth VTFET. As shown in FIG. 5A, the third VTFET includes a shared bottom source/drain region 520A, a fin 534A, and a top source/drain region (not shown). As shown in FIG. 5A, the fourth VTFET includes a shared bottom source/drain region 520A, a fin 536A, and a top source/drain region (not shown). As described above, the top source/drain region for each VTFET is not shown for simplicity of the drawings. It should be noted, in a preferred embodiment, the shared bottom source/drain region 520A may be connected to a backside power delivery network (not shown). In an alternative embodiment, the shared bottom source/drain region 520A may be connected to a frontside power delivery network (not shown).

As shown in FIG. 5A, in an embodiment, the semiconductor structure 500A the third VTFET includes a gate region 544A surrounding at least a portion of the fin 534A and the fourth VTFET includes a gate region 546A surrounding at least a portion of the fin 536A. In an embodiment, semiconductor structure 500A includes a shared gate region 580 connected to both the gate region 544A and gate region 546A. In an embodiment, shared gate region 580 is connected to gate contact 582 and gate contact 582 extends towards the frontside of the semiconductor structure 500A. In an embodiment, gate contact 582 may extend towards the backside of the semiconductor structure 500A. In an alternative embodiment, shared gate region 580 may not exist, and both gate region 544A and gate region 546A may have their own gate contact (not shown) that extends towards the frontside or backside of the semiconductor structure 400A.

As shown in FIG. 5A, in an embodiment, the semiconductor structure 500A includes a shared top contact 560A connected to the first VTFET top source/drain region, second VTFET top source/drain region, third VTFET top source/drain region, and fourth VTFET top source/drain region. The shared top contact 560A extends 1 CPP from the second VTFET and third VTFET and connects to the shared backside contact 562A. In an embodiment, the shared backside contact 562A is centered approximately 1 CPP from the center of the adjacent VTFETs. In an embodiment, the shared backside contact 562A extends to connect to a backside RX layer 512A. In an alternative embodiment, the backside RX layer 512 may not exist, and the shared backside contact 562A extends to connect to a backside power delivery network (not shown). In an embodiment, as shown here, shared top contact 560A extends to a left edge of gate region 540A and a right edge of gate region 546A. In alternative embodiments, as known in the art, shared top contact 560A may extend any horizontal distance as long as shared top contact 560A is at least electrically connected to the top source/drain region(s), described below.

Figure 5B:
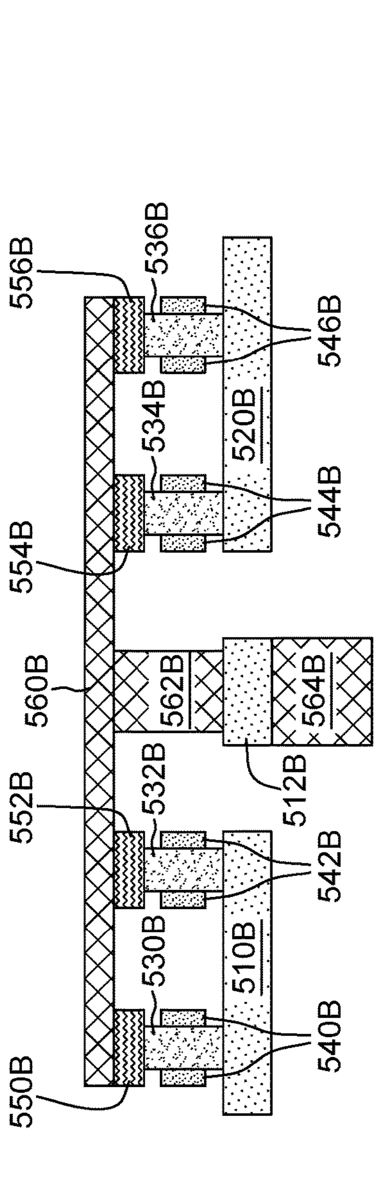
FIG. 5B depicts a cross-sectional view of section B of the semiconductor structure including two sets in parallel of two VTFET in parallel in accordance with an embodiment of the present invention.

FIG. 5B depicts a cross-sectional view of section B of the semiconductor structure including two sets in parallel of two VTFET in parallel in accordance with an embodiment of the present invention. As shown in FIG. 5B, the first VTFET includes a shared bottom source/drain region 510B, a fin 530B, a top source/drain region 550B and a gate region 540B surrounding at least a portion of fin 530B. As shown in FIG. 5B, the second VTFET includes a shared bottom source/drain region 510B, a fin 532B, a top source/drain region 552B, and a gate region 542B surrounding at least a portion of fin 532B. It should be noted, in alternative embodiments, the first VTFET and second VTFET may have a shared a top source/drain region or may have individual/separate bottom source/drain regions. As noted above, in a preferred embodiment, the shared bottom source/drain region 510B may be connected to a backside power delivery network (not shown).

As shown in FIG. 5B, the third VTFET includes a shared bottom source/drain region 520B, a fin 534B, a top source/drain region 554B and a gate region 544B surrounding at least a portion of fin 534B. As shown in FIG. 5B, the fourth VTFET includes a shared bottom source/drain region 520B, a fin 536B, a top source/drain region 556B, and a gate region 546B surrounding at least a portion of fin 536B. It should be noted, in alternative embodiments, the first VTFET and second VTFET may have a shared a top source/drain region or may have individual/separate bottom source/drain regions. As noted above, in a preferred embodiment, the shared bottom source/drain region 520B may be connected to a backside power delivery network (not shown).

As shown in FIG. 5B, in an embodiment, the semiconductor structure 500B includes a shared top contact 560B connected to the first VTFET top source/drain region 550B, second VTFET top source/drain region 552B, third VTFET top source/drain 554B, and fourth VTFET top source/drain region 556B. The shared top contact 560B extends 1 CPP from both of the VTFET adjacent to the shared backside contact 562B before connecting to the shared backside contact 562B. In an embodiment, the shared backside contact 562B is centered approximately 1 CPP from the center of the adjacent VTFETs. In an embodiment, the shared backside contact 562B extends to a backside RX layer 512B which may connect to other devices (not shown). In an alternative embodiment, the backside RX layer 512B may not exist and the shared backside contact 562B extends to connect to a backside power delivery network (not shown). In an embodiment, the backside RX layer 512B connects to a backside contact 564B. In an embodiment, the backside contact 564B connects to a backside power delivery network (not shown). In an embodiment, the shared backside contact 562B is substantially similar to the cell height of either the first VTFET, the second VTFET, the third VTFET, or the fourth VTFET in semiconductor structure 500B.

Figure 6A:
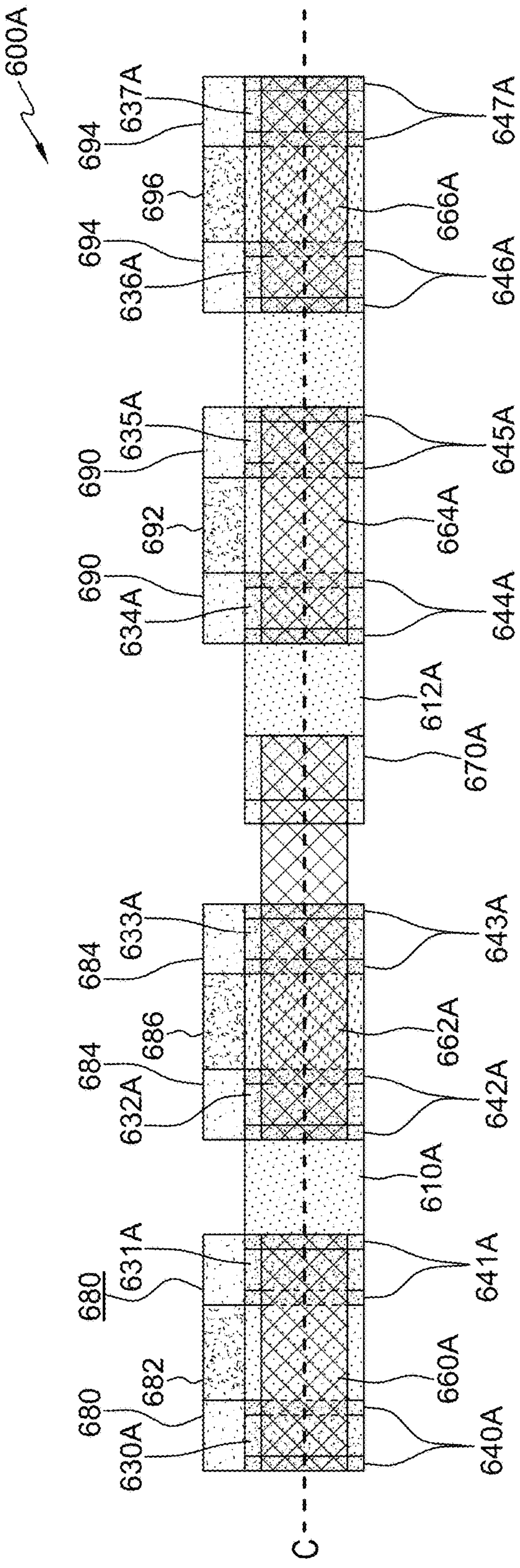
FIG. 6A depicts a top view of the semiconductor structure including two sets of two VTFET in parallel in series and two sets of two VTFET in parallel in parallel in accordance with an embodiment of the present invention.

FIG. 6A depicts a top view of the semiconductor structure including two sets of two VTFET in parallel in series and two sets of two VTFET in parallel in parallel in accordance with an embodiment of the present invention. In an embodiment, the first set of VTFET in FIG. 6A are shown in parallel. In other words, a shared input is provided to the first VTFET and the second VTFET and a shared output extends from both the first VTFET and second VTFET. As shown in FIG. 6A, the first VTFET includes a shared bottom source/drain region 610A, a fin 630A, and a top source/drain region (not shown). As shown in FIG. 6A, the second VTFET includes a shared bottom source/drain region 610A, a fin 631A, and a top source/drain region (not shown). As described, the top source/drain region for each VTFET is not shown for simplicity of the drawings. In an embodiment, the first set of VTFET include a top contact 660A connected to a top source/drain region (not shown) of both the first VTFET and second VTFET and a power delivery network (not shown).

As shown in FIG. 6A, in an embodiment, the semiconductor structure 600A the first VTFET includes a gate region 640A surrounding at least a portion of the fin 630A and the second VTFET includes a gate region 641A surrounding at least a portion of the fin 631A. In an embodiment, semiconductor structure 600A includes a shared gate region 680 connected to both the gate region 640A and gate region 641A. In an embodiment, shared gate region 680 is connected to gate contact 682 and gate contact 682 extends towards the frontside of the semiconductor structure 600A. In an embodiment, gate contact 682 may extend towards the backside of the semiconductor structure 600A. In an alternative embodiment, shared gate region 680 may not exist, and both gate region 640A and gate region 641A may have their own gate contact (not shown) that extends towards the frontside or backside of the semiconductor structure 600A.

In an embodiment, the second set VTFET in FIG. 6A are shown in parallel. In other words, a shared input is provided to the third VTFET and the fourth VTFET and a shared output extends from both the third VTFET and fourth VTFET. As shown in FIG. 6A, the third VTFET includes a shared bottom source/drain region 610A, a fin 632A, and a top source/drain region (not shown). As shown in FIG. 6A, the fourth VTFET includes a shared bottom source/drain region 610A, a fin 633A, and a top source/drain region (not shown). As described, the top source/drain region for each VTFET is not shown for simplicity of the drawings.

As shown in FIG. 6A, in an embodiment, the semiconductor structure 600A the third VTFET includes a gate region 642A surrounding at least a portion of the fin 632A and the fourth VTFET includes a gate region 643A surrounding at least a portion of the fin 633A. In an embodiment, semiconductor structure 600A includes a shared gate region 684 connected to both the gate region 642A and gate region 643A. In an embodiment, shared gate region 684 is connected to gate contact 686 and gate contact 686 extends towards the frontside of the semiconductor structure 600A. In an embodiment, gate contact 686 may extend towards the backside of the semiconductor structure 600A. In an alternative embodiment, shared gate region 684 may not exist, and both gate region 642A and gate region 643A may have their own gate contact (not shown) that extends towards the frontside or backside of the semiconductor structure 600A.

In an embodiment, the first set of VTFET and the second set of VTFET are in series. In an embodiment, this is accomplished using shared bottom source/drain region 610A. As described above, the shared output of the first set of VTFET is a shared input of the second set of VTFET resulting in the first set of VTFET and second set of VTFET being in series.

In an embodiment, the third set of VTFET in FIG. 6A are shown in parallel. In other words, a shared input is provided to the fifth VTFET and the sixth VTFET and a shared output extends from both the fifth VTFET and sixth VTFET. As shown in FIG. 6A, the fifth VTFET includes a shared bottom source/drain region 612A, a fin 634A, and a top source/drain region (not shown). As shown in FIG. 6A, the sixth VTFET includes a shared bottom source/drain region 612A, a fin 635A, and a top source/drain region (not shown). As described, the top source/drain region for each VTFET is not shown for simplicity of the drawings. In an embodiment, the third set of VTFET include a top contact 664A connected to a top source/drain region (not shown) of both the first VTFET and second VTFET and a power delivery network (not shown).

As shown in FIG. 6A, in an embodiment, in the semiconductor structure 600A the fifth VTFET includes a gate region 644A surrounding at least a portion of the fin 634A and the sixth VTFET includes a gate region 645A surrounding at least a portion of the fin 635A. In an embodiment, semiconductor structure 600A includes a shared gate region 690 connected to both the gate region 644A and gate region 645A. In an embodiment, shared gate region 690 is connected to gate contact 692 and gate contact 692 extends towards the frontside of the semiconductor structure 600A. In an embodiment, gate contact 692 may extend towards the backside of the semiconductor structure 600A. In an alternative embodiment, shared gate region 690 may not exist, and both gate region 644A and gate region 645A may have their own gate contact (not shown) that extends towards the frontside or backside of the semiconductor structure 600A.

In an embodiment, the fourth set VTFET in FIG. 6A are shown in parallel. In other words, a shared input is provided to the seventh VTFET and the eighth VTFET and a shared output extends from both the seventh VTFET and eighth VTFET. As shown in FIG. 6A, the seventh VTFET includes a shared bottom source/drain region 612A, a fin 636A, and a top source/drain region (not shown). As shown in FIG. 6A, the eighth VTFET includes a shared bottom source/drain region 612A, a fin 637A, and a top source/drain region (not shown). As described, the top source/drain region for each VTFET is not shown for simplicity of the drawings. In an embodiment, the fourth set of VTFET include a top contact 666A connected to a top source/drain region (not shown) of both the seventh VTFET and eighth VTFET and a power delivery network (not shown).

As shown in FIG. 6A, in an embodiment, in the semiconductor structure 600A the seventh VTFET includes a gate region 646A surrounding at least a portion of the fin 636A and the eighth VTFET includes a gate region 647A surrounding at least a portion of the fin 637A. In an embodiment, semiconductor structure 600A includes a shared gate region 694 connected to both the gate region 646A and gate region 647A. In an embodiment, shared gate region 694 is connected to gate contact 696 and gate contact 696 extends towards the frontside of the semiconductor structure 600A. In an embodiment, gate contact 696 may extend towards the backside of the semiconductor structure 600A. In an alternative embodiment, shared gate region 694 may not exist, and both gate region 646A and gate region 647A may have their own gate contact (not shown) that extends towards the frontside or backside of the semiconductor structure 600A.

In an embodiment, the third set of VTFET and the fourth set of VTFET are in parallel. In an embodiment, this is accomplished using shared bottom source/drain region 612A. As described above, the shared output of the third set of VTFET is the same shared output of the fourth set of VTFET resulting in the third set of VTFET and fourth set of VTFET being in parallel.

As shown in FIG. 6A, in an embodiment, the semiconductor structure 600A includes a shared top contact 662A connected to the third VTFET top source/drain region and fourth VTFET top source/drain region. The shared top contact 662A extends 1 CPP from the fourth VTFET to 1 CPP from the fifth VTFET and connects to the shared backside contact 670A. In an embodiment, the shared backside contact 670A is centered approximately 1 CPP from the center of the adjacent VTFETs. In an embodiment, the shared backside contact 670A extends to connect shared bottom source/drain 612A.

In an embodiment, as described above, top contact 660, shared top contact 662A, top contact 664A, and top contact 666A may extend any horizontal distance as long as they are at least electrically connected to the top source/drain region (s) of their associated VTFET, described below.

Figure 6B:
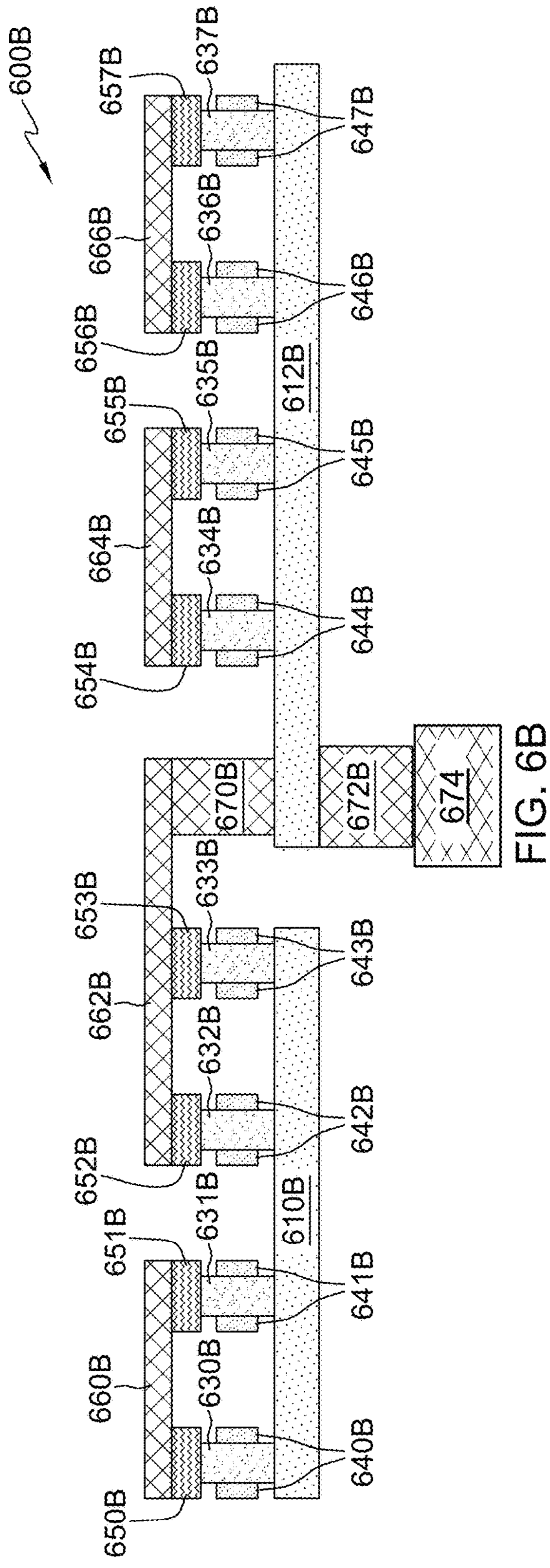
FIG. 6B depicts a cross-sectional view of section C of the semiconductor structure including two sets of two VTFET in parallel in series and two sets of two VTFET in parallel in parallel in accordance with an embodiment of the present invention.

FIG. 6B depicts a cross-sectional view of section C of the semiconductor structure including two sets of two VTFET in parallel in series and two sets of two VTFET in parallel in parallel in accordance with an embodiment of the present invention. As shown in FIG. 6B, the first VTFET includes a shared bottom source/drain region 610B, a fin 630B, a top source/drain region 650B and a gate region 640B surrounding at least a portion of fin 630B. As shown in FIG. 6B, the second VTFET includes a shared bottom source/drain region 610B, a fin 631B, a top source/drain region 651B, and a gate region 641B surrounding at least a portion of fin 631B. It should be noted, in alternative embodiments, the first VTFET and second VTFET may have a shared a top source/drain region or may have individual/separate bottom source/drain regions. As noted above, in a preferred embodiment, the shared bottom source/drain region 610B may be connected to a backside power delivery network 674.

As shown in FIG. 6B, the third VTFET includes a shared bottom source/drain region 610B, a fin 632B, a top source/drain region 652B and a gate region 642B surrounding at least a portion of fin 632B. As shown in FIG. 6B, the fourth VTFET includes a shared bottom source/drain region 610B, a fin 633B, a top source/drain region 653B, and a gate region 643B surrounding at least a portion of fin 633B. It should be noted, in alternative embodiments, the third VTFET and fourth VTFET may have a shared a top source/drain region or may have individual/separate bottom source/drain regions. As noted above, in a preferred embodiment, the shared bottom source/drain region 610B may be connected to a backside power delivery network 674.

As shown in FIG. 6B, the fifth VTFET includes a shared bottom source/drain region 612B, a fin 634B, a top source/drain region 654B and a gate region 644B surrounding at least a portion of fin 634B. As shown in FIG. 6B, the sixth VTFET includes a shared bottom source/drain region 612B, a fin 635B, a top source/drain region 655B, and a gate region 645B surrounding at least a portion of fin 635B. It should be noted, in alternative embodiments, the fifth VTFET and sixth VTFET may have a shared a top source/drain region or may have individual/separate bottom source/drain regions.

As shown in FIG. 6B, the seventh VTFET includes a shared bottom source/drain region 612B, a fin 636B, a top source/drain region 656B and a gate region 646B surrounding at least a portion of fin 636B. As shown in FIG. 6B, the eighth VTFET includes a shared bottom source/drain region 612B, a fin 637B, a top source/drain region 657B, and a gate region 647B surrounding at least a portion of fin 637B. It should be noted, in alternative embodiments, the seventh VTFET and eighth VTFET may have a shared a top source/drain region or may have individual/separate bottom source/drain regions.

As shown in FIG. 6B, in an embodiment, the semiconductor structure 600B includes a shared top contact 660B connected to the first VTFET top source/drain region 650B and second VTFET top source/drain region 651B. In an embodiment, the semiconductor structure 600B includes a shared top contact 662B connected to the third VTFET top source/drain region 652B and fourth VTFET top source/drain region 653B. The shared top contact 662B extends 1 CPP from both of the VTFET adjacent to the shared backside contact 670B before connecting to the shared backside contact 670B. In an embodiment, the shared backside contact 670B is centered approximately 1 CPP from the center of the adjacent VTFETs. The shared top contact 660B is connected to a frontside or backside power delivery network (not shown).

As shown in FIG. 6B, in an embodiment, the semiconductor structure 600B includes a shared top contact 664B connected to the fifth VTFET top source/drain region 654B and sixth VTFET top source/drain region 655B. In an embodiment, the semiconductor structure 600B includes a shared top contact 666B connected to the seventh VTFET top source/drain region 656B and eighth VTFET top source/drain region 657B. The shared top contact 664B and shared top contact 666B are connected to a frontside or backside power delivery network (not shown).

In an embodiment, the shared backside contact 670B extends to bottom source/drain region 612B. In an embodiment, the shared backside contact 670B connects to a backside contact 672B. In an embodiment, the backside contact 672B connects to a backside power delivery network (not shown). In an embodiment, the shared backside contact 670B is substantially similar to the cell height of any of the VTFET in semiconductor structure 500B.

Figure 7:
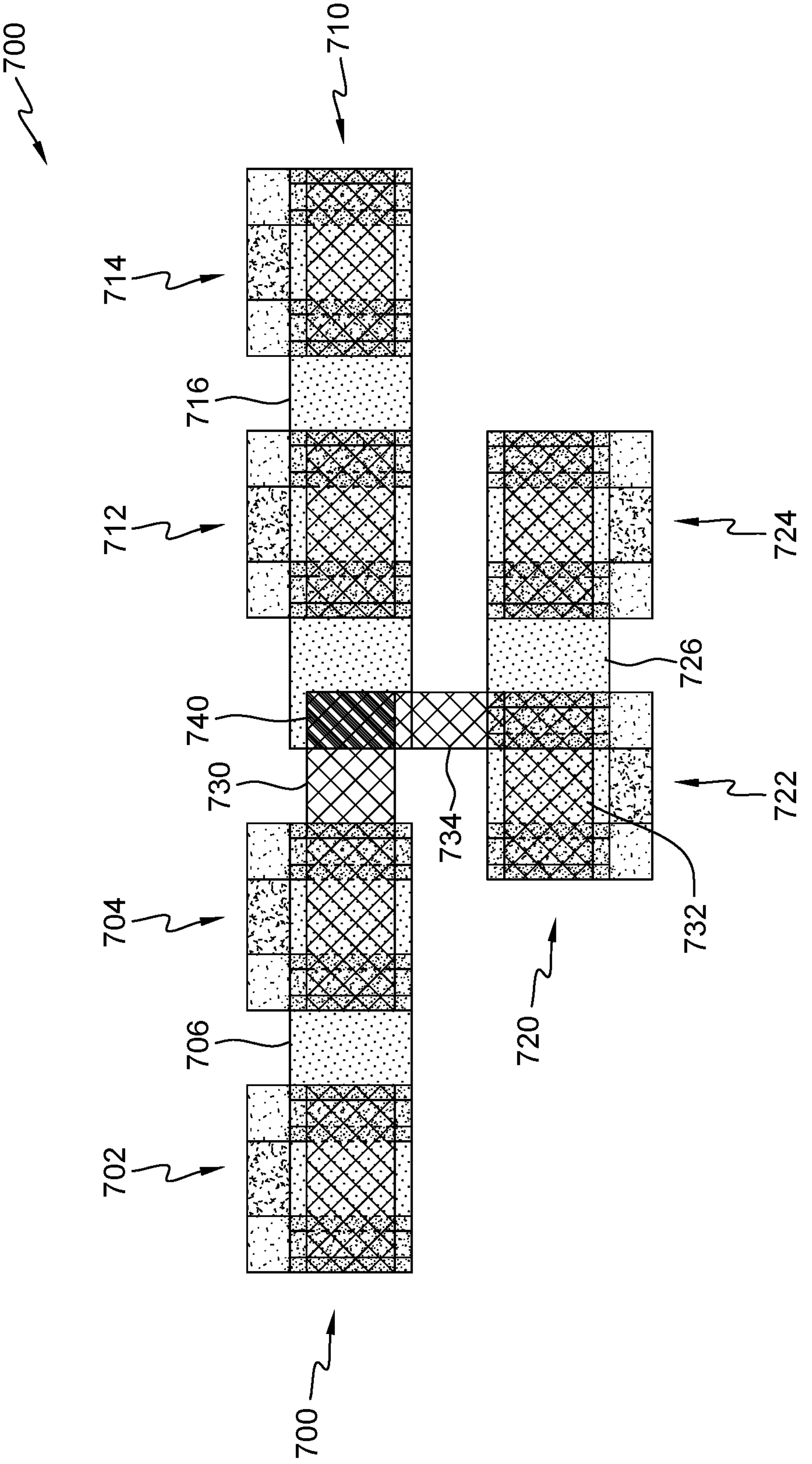
FIG. 7 depicts a top view of the semiconductor structure including three sets in parallel of two sets in series of two VTFET in parallel in accordance with an embodiment of the present invention.

FIG. 7 depicts a top view of the semiconductor structure 700 including a first set of two sets in series of two VTFET in parallel, a second set of two sets in series of two VTFET in parallel, and the output of the first set and the second set is connected to the output of a third set of two sets in parallel of two VTFET in parallel in accordance with an embodiment of the present invention. As shown in FIG. 7, semiconductor structure 700 includes VTFET pair 702, 704, 712, 714, 722, and 724. Each of VTFET pair 702, 704, 712, 714, 722, and 724 include two VTFET, in parallel. In other words, each VTFET pair 702, 704, 712, 714, 722, and 724 include a shared input (source/drain region or contact region) and shared output (source/drain region or contact region). VTFET 702, 704, 712, 714, 722, and 724 are similar to VTFET structures described herein and include similar features.

In an embodiment, VTFET pair 702 and VTFET pair 704 are in series. In an embodiment, VTFET pair 712 and VTFET pair 714 are in parallel 710. In an embodiment, VTFET pair 722 and VTFET pair 724 are in series 720. In an embodiment, VTFET pair 702 is connected to a frontside power delivery network (not shown) through a top contact connected to the top source/drain region(s) of VTFET pair 702. A shared bottom source/drain region 706 connects VTFET pair 702 to VTFET pair 704, making them in series. In an embodiment, VTFET pair 712 and 714 are connected to a frontside power delivery network (not shown) though a top contact connected to a top source/drain region(s) of VTFET pair 712, 714, respectively. A shared bottom source/drain region 716 connects VTFET pair 712 to VTFET pair 714, making them in parallel. In an embodiment, VTFET pair 724 is connected to a frontside power delivery network (not shown) through a top contact connected to a top source/drain region(s) of VTFET pair 724. A shared bottom source/drain region 726 connects VTFET pair 724 to VTFET 722 pair, making them in series and the output of VTFET 722 pair is connected to top contact 734.

In an embodiment, VTFET pair 704 has a shared top contact 730 connected to top contact 734. In an embodiment, the top contact 730 and top contact 734 are connected to shared bottom source/drain region 716 by a backside contact 740.

In an embodiment, as described above, top contact (s) may extend any horizontal distance as long as they are at least electrically connected to the top source/drain region(s) of their associated VTFET, described above.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:

a first vertical-transport field-effect transistor (VTFET) on a wafer;

a second VTFET adjacent to the first VTFET on the wafer;

a backside power delivery network on a backside of the wafer;

a shared frontside contact, wherein:

the shared frontside contact is on a frontside of the wafer; and the shared frontside contact is directly connected to a first top source/drain region of the first VTFET, a second top source/drain region of the second VTFET, and a shared backside contact; and a shared bottom source/drain region directly connected to the shared backside contact and a plurality of additional VTFETs, and connected to a backside power delivery network.

2. The semiconductor device of claim 1, wherein the first VTFET and the second VTFET are in parallel.

3. The semiconductor device of claim 1, wherein the first VTFET and the second VTFET are each a first width, wherein the first width is a contacted poly pitch (CPP), and wherein shared frontside contact is adjacent to the second VTFET by the first width.

4. The semiconductor device of claim 1, further comprising:

a bottom source/drain region of a third FET connected to the shared frontside contact.

5. The semiconductor device of claim 1, wherein the backside power delivery network is selected from the group consisting of power and ground.

6. A semiconductor device comprising:

a first row of vertical-transport field-effect transistors (VTFETs) on the semiconductor device;

a second row of VTFETs;

a backside power delivery network on a backside of the semiconductor device, wherein the backside power delivery network is directly connected to a backside contact directly connected to a source/drain region on the backside of at least one of the first row; and a shared top contact on a frontside of the semiconductor device directly connected to i) a shared backside contact directly connected to a shared bottom source/drain region of the first row; ii) a top plurality of source/drain regions of the first row; and iii) a top contact directly connected to a source/drain region of the second row.

7. The semiconductor device of claim 6, wherein a first group of VTFET of the first row are horizontally adjacent to a second group of VTFET of the first row.

8. The semiconductor device of claim 7, wherein a third group of VTFET of the first row are vertically adjacent the first group of VTFET and second group of VTFET.

9. The semiconductor device of claim 6, wherein a first group of VTFET of the first row are vertically adjacent to a second group of VTFET of the first row.

10. The semiconductor device of claim 7, wherein a third group of VTFET of the first row are horizontally adjacent the first group of VTFET and second group of VTFET.

11. The semiconductor device of claim 6, wherein at least a portion of the first row have a shared active area connected to the shared top contact.

12. The semiconductor device of claim 6, wherein the backside power delivery network is selected from the group consisting of power and ground.

13. The semiconductor device of claim 8, wherein the third group of VTFET are in series.

14. The semiconductor device of claim 8, wherein the third group of VTFET are in parallel.

15. A semiconductor device comprising:

a first vertical-transport field-effect transistor (VTFET) on a wafer;

a second VTFET adjacent to the first VTFET on the wafer;

a third VTFET adjacent to the first VTFET on the wafer on a row different from the second VTFET;

wherein the first VTFET, the second VTFET, and the third VTFET are each a first width, wherein the first width is a contacted poly pitch (CPP);

a shared frontside contact connected to the first VTFET and the second VTFET; and a top contact directly connected to, and oriented perpendicularly to, the shared frontside contact and directly connected to the third VTFET, wherein the shared frontside contact is on a frontside of the wafer and electrically connected to a backside power delivery network.

16. The semiconductor device of claim 15, wherein the shared frontside contact is horizontally adjacent to the first VTFET and second VTFET by the first width and wherein the shared frontside contact is vertically adjacent to the third VTFET by the first width.

17. The semiconductor device of claim 15, wherein the shared frontside contact is connected to a first top source/drain region of the first VTFET, a second top source/drain region of the second VTFET and a third bottom source/drain region of the third VTFET.

18. The semiconductor device of claim 15, wherein the shared frontside contact is connected to a first top source/drain region of the first VTFET, a second bottom source/drain region of the second VTFET and a third top source/drain region of the third VTFET.

19. The semiconductor device of claim 15, wherein the shared frontside contact is a second width, wherein the second width is double the first width.

20. The semiconductor device of claim 15, wherein the first VTFET, second VTFET, and third VTFET are in parallel.

* * * * *